(12) United States Patent
Liao

(10) Patent No.: US 9,398,716 B2
(45) Date of Patent: Jul. 19, 2016

(54) SERVER CASING WITH QUICK RELEASE RACK STRUCTURE FOR SERVER

(71) Applicant: Celestica Technology Consultancy (Shanghai) Co., Ltd., Shanghai (CN)

(72) Inventor: Te Ming Liao, Shanghai (CN)

(73) Assignee: CELESTICA TECHNOLOGY CONSULTANCY (SHANGHAI) CO., LTD., Shanghai (CN)

( * ) Notice: Subject to any disclaimer, the term of this patent is extended or adjusted under 35 U.S.C. 154(b) by 10 days.

(21) Appl. No.: 14/558,399

(22) Filed: Dec. 2, 2014

(65) Prior Publication Data

US 2015/0201521 A1   Jul. 16, 2015

(30) Foreign Application Priority Data

Jan. 13, 2014 (TW) .............................. 103200664 U

(51) Int. Cl.
*A47B 81/00* (2006.01)
*H05K 7/14* (2006.01)

(52) U.S. Cl.
CPC ................................... *H05K 7/1489* (2013.01)

(58) Field of Classification Search
CPC ..................................................... A47B 88/047
USPC ........... 312/333, 334.1, 334.7, 334.8, 334.44, 312/319.1, 223.1
See application file for complete search history.

(56) References Cited

U.S. PATENT DOCUMENTS

| 4,579,305 | A | * | 4/1986 | McKenzie | F16L 3/22 248/222.41 |
|---|---|---|---|---|---|
| 6,612,078 | B2 | * | 9/2003 | Hawang | A47B 47/042 403/353 |
| 8,523,301 | B1 | * | 9/2013 | Britson | A47B 88/04 312/333 |
| 8,540,328 | B2 | * | 9/2013 | Chen | A47B 88/16 312/333 |
| 2004/0201337 | A1 | * | 10/2004 | Wuestefeld | A47L 15/4265 312/311 |
| 2008/0129172 | A1 | * | 6/2008 | Freeberg | B25H 3/028 312/348.4 |

* cited by examiner

*Primary Examiner* — Matthew Ing
(74) *Attorney, Agent, or Firm* — Polsinelli PC

(57) ABSTRACT

A rack structure for mounting a server in a server system with a slide channel and a retention groove, includes: a rack formed with one engagement element slidable non-removably within the channel; and a rotary rod having a first end connected pivotally to the rack via a pivot pin and a second end provided with a slide stick extending slidably into the groove. The rotary rod is rotatable about the pivot pin relative to the rack between a locking position, where the rotary rod is generally aligned with the rack while the slide stick engages a first end of the groove so as to retain the rack non-movably in the channel, and an unlocked position, where the rotary rod extends generally transverse to the rack while the slide stick engages a second end of the groove to permit sliding action of the rack within the channel.

20 Claims, 6 Drawing Sheets

SERVER CASING WITH QUICK RELEASE RACK STRUCTURE FOR SERVER

CROSS-REFERENCE TO RELATED APPLICATION

This application claims the priority of Taiwanese patent application No. 103200664, filed on Jan. 13, 2014, which is incorporated herewith by reference.

BACKGROUND OF THE INVENTION

1. Field of the Invention

The present invention relates generally to a rack structure, and more particularly to a quick release rack structure for server so that once a server is mounted in a server center via the rack structure of the present invention can be released quickly from the server center upon circumstances require.

2. The Prior Arts

Development in the server system provides several types of server installation on a conventional 1U (1U=4.445 cm) or servers tower. The traditional way of server mounting requires a relatively large space is replaced by a blade server system since the latter requires much smaller space owing to reduced dimension of modem servers, namely a blade server. In addition, each blade server in fact is a chassis housing multiple thin, modular electronic circuit boards, since a single blade server cannot operate independently and hence several blade servers are collectively disposed in an enclosure. Since a blade server system uses only a single power supply, a cooling unit and several other components shared among the blade servers, it provides many advantages, such as reduced energy, reduced power but effective cooling, increase storage space, minimum administration and lesser cabling and etc.

Presently, a majority of large companies or business centers employ a blade server system, wherein a plurality of blade servers are installed within an enclosure to conduct file sharing, heavy load data communication, storing a great abundant of data. Sometimes, it is required to change a blade server, if the former is not compatible with the existing requirements, such as web page serving and caching so as to be replaced with a larger blade server. Since the presently existing enclosure has fixed rack structure, the storage space for receiving the replaced blade server cannot be easily varied, thereby resulting in inconvenient to install the new blade server in the enclosure.

Therefore, it is highly desired to develop a quick release rack structure for mounting a server in a server system, such that the rack structure holding a server or a blade server thereon can be detached ore released quickly and easily so as to permit flexible use of storage space within the server system.

SUMMARY OF THE INVENTION

A primary objective of the present invention is to provide a quick release rack structure for mounting a server to a server system and since the rack structure of the present invention can be detached or released quickly from the server system, a server mounting space thereof can be varied if circumstance demands.

The quick release rack structure of the present invention is used for mounting a server in a server system having a slide channel and a retention groove. The rack structure accordingly includes: a rack formed with at least one engagement element that is adapted to be slidable non-removably within the slide channel; and a rotary rod having a first end connected pivotally to the rack via a pivot pin and a second end provided with a slide stick extending slidably into the retention groove. The rotary rod is rotatable about the pivot pin relative to the rack between a locking position, where the rotary rod is generally aligned with the rack while the slide stick engages a first end of the retention groove so as to retain the rack non-movably in the slide channel, and an unlocked position, where the rotary rod extends generally transverse to the rack while the slide stick engages a second end of the retention groove opposite to the first end so as to permit sliding action of the rack within the slide channel.

In one embodiment of the present invention, the rack can be mounted directly within a slide channel defined by a single channel forming element or a plurality of channel forming elements.

The quick release rack structure of the present invention includes a biasing member disposed between and biasing the rack and the rotary rod to facilitate rotation of the rotary rod about the pivot pin during movement between the locking and unlocked positions.

A server casing with quick release rack structure for a server of the present invention includes: two partitions having opposite side surfaces, each of which is formed with a slide channel and a retention groove; a pair of racks, each of which is formed with at least one engagement element that is adapted to be slidable non-removably within the slide channel of a respective one of the partitions; and a pair of rotary rods, each having a first end connected pivotally to a respective one of the racks via a pivot pin and a second end provided with a slide stick extending slidably into the retention groove of the respective one of the partitions.

Compared with the prior arts, the rack structure of the present invention for mounting a server in a server system can be detached or released quickly and easily so as to vary the server-reception space in the server system, thereby facilitate the flexible use of space within the server system.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENTS

The accompanying drawings are included to provide a further understanding of the invention, and are incorporated in and constitute a part of this specification. The drawings illustrate embodiments of the invention and, together with the description, serve to explain the principles of the invention.

Figure 1:
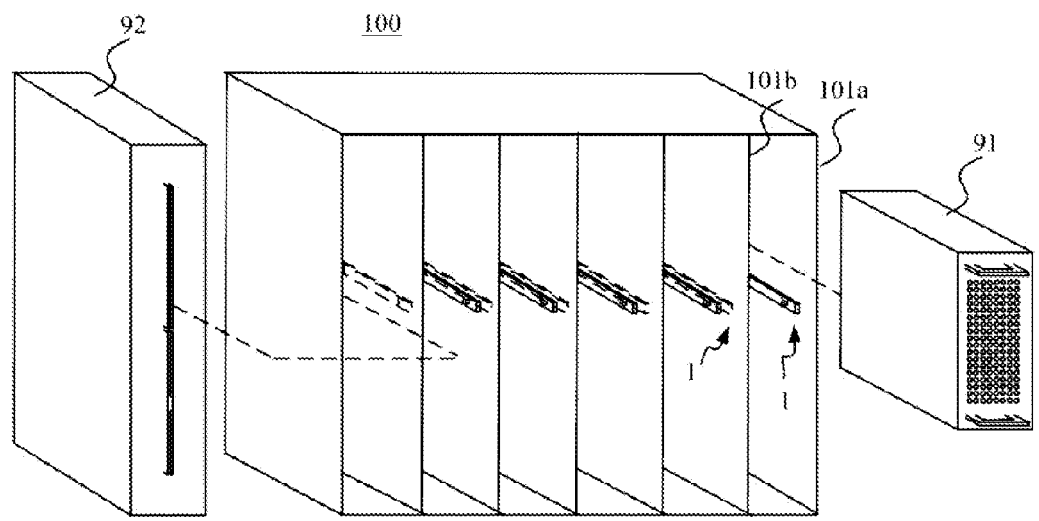
FIG. 1 is a perspective view of a quick release rack structure of the present invention for mounting a server in a server system.
Figure 2:
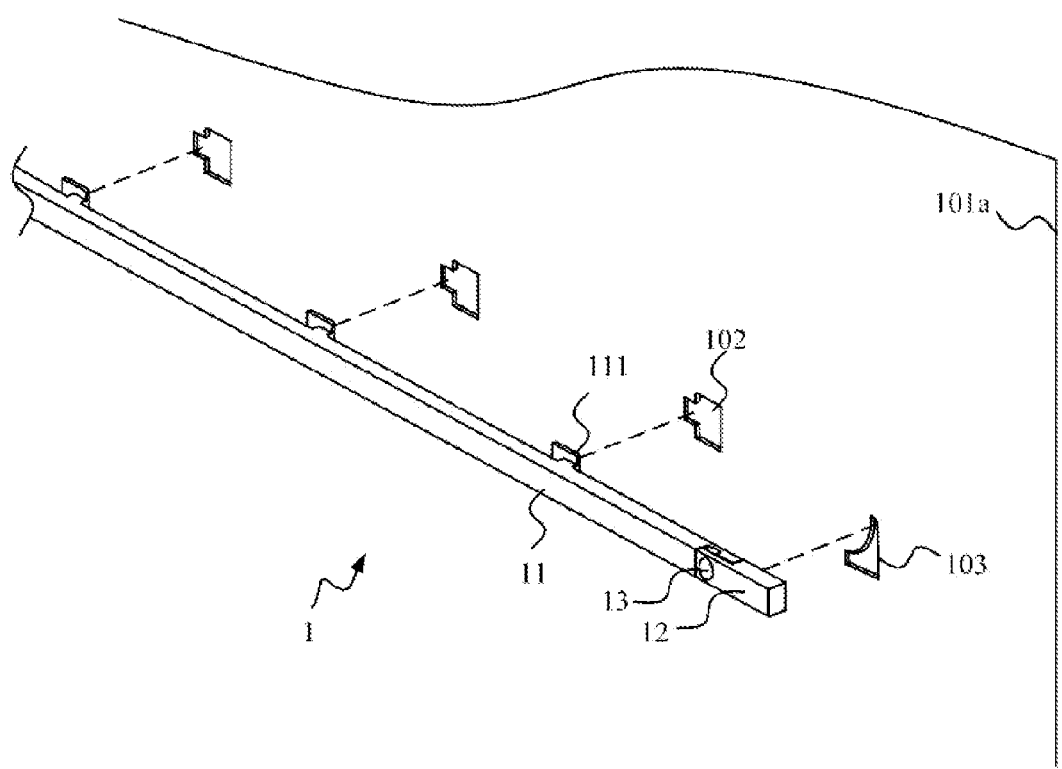
FIG. 2 is a perspective view of the quick release rack structure of the present invention for mounting a server in a server system shown in FIG. 1.

Referring to FIGS. 1 and 2, wherein FIG. 1 is a perspective view of a quick release rack structure 1 of the present invention for mounting a server in a server system and FIG. 2 is a perspective view of the quick release rack structure 1 of the present invention for mounting a server in a server system shown in FIG. 1. The server system or enclosure 100 shown in FIG. 1 includes at least two partitions 101a, 101b, wherein the quick release rack structure 1 of the present invention holds a server 91, is to be mounted on the partitions 101a, 101b. In case of mounting a larger server 92 different from the server 91 in dimension, the quick release rack structure 1 of the present invention can be detached or released from the partitions 101a, 101b so as to vary the storage space (slightly larger than the previous ones) so that the larger server 92 can be mounted directly in a storage space defined between the partitions 101a, 101b.

Figure 3:
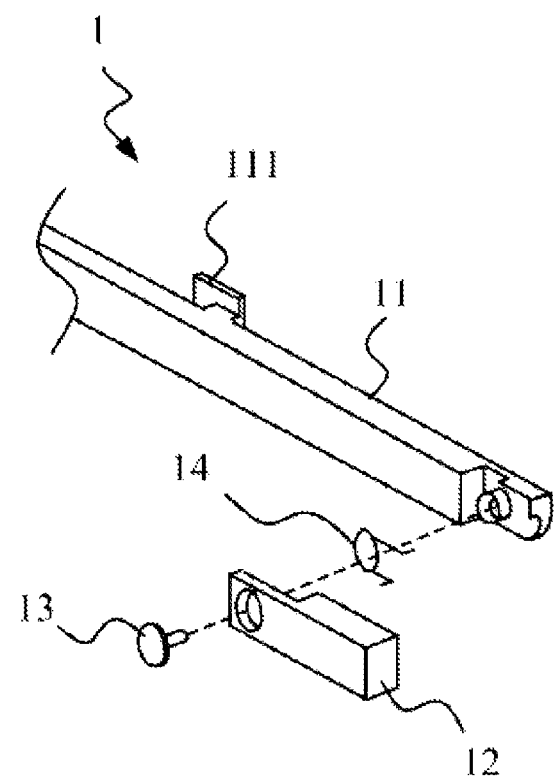
FIG. 3 is a perspective and exploded view of the quick release rack structure of the present invention.
Figure 4:
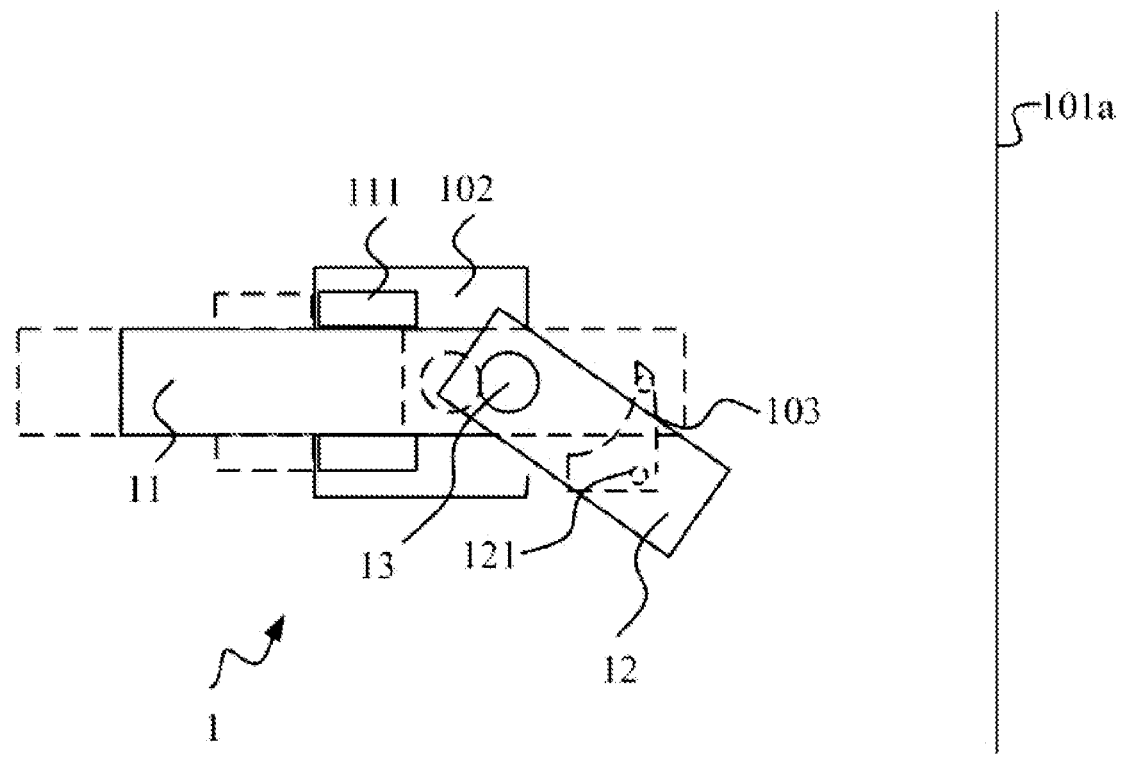
FIG. 4 is a lateral side view of the quick release rack structure of the present invention, wherein a rotary rod of the rack structure is shown in an unlocked position (solid lines) relative to a rack.

Referring to FIGS. 3 and 4, wherein FIG. 3 is a perspective and exploded view of the quick release rack structure 1 of the present invention and FIG. 4 is a lateral side view of the quick release rack structure 1 of the present invention, wherein a rotary rod 12 of the rack structure 1 is shown in an unlocked position (solid lines) relative to a rack 11. As illustrated in FIG. 2, each partition 101 of the enclosure 100 is provided with three aligned channel forming elements cooperatively defining a slide channel 102. Each partition 101 of the enclosure 100 is further provided with at least one groove-forming element that defines a retention groove 103 generally transverse to the slide channel 102. The quick release rack structure 1 of the present invention includes a pair of racks 11 and a pair of rotary rods 12. For illustration purpose, only one rack 11 and one rotary rod 12 are shown in the drawings.

Each rack 11 is elongated and fabricated from metal, is formed with three engagement elements 111, which are slidable non-removably within the slide channels 102. Each slide channel 102 is T-shaped generally and extends in a horizontal direction (see FIG. 2) such that one portion thereof has a greater width when compared to a narrower width of the other portion thereof. The number of the rack 11 should not be limited only to three, but should depend on the requirement of the application. In this embodiment, each engagement element 111 is disposed at one side surface of the respective rack 11 and extends perpendicularly and upwardly with respect to a longitudinal length of the respective rack 11.

Each rotary rod 12 is fabricated from plastic materials, has a first end connected pivotally to the rack 11 via a pivot pin 13 and a second end provided with a slide stick 121 extending slidably into the retention groove 103.

Under this condition, the rotary rod 12 is rotatable about the pivot pin 13 relative to the rack 11 between a locking position, where the rotary rod 12 is generally aligned with the rack 11 (with the engagement element 111 being located within the narrower width of the slide channel 102) while the slide stick 121 engages a first end of the retention groove 103 (shown by dotted lines in FIG. 4) so as to retain the rack 11 non-movably in the slide channel 102 and thus preventing the rack 11 from being pulled outward from the slide channel 102, and an unlocked position, where the rotary rod 12 extends generally transverse or incline relative to the rack 11 (with the engagement element 111 being located within the greater width of the slide channel 102) while the slide stick 121 engages a second end of the retention groove 103 opposite to the first end so as to permit sliding action of the rack 11 within the slide channel 102 (shown by solid lines in FIG. 4). In other words, when the rotary rod 12 is disposed at the unlocked position, the engagement elements 111 of the racks 11 are slidable within the slide channels 102. Therefore, when at the unlocked position, the rack 11 can be pulled outward from the slide channel 102 so as to permit removal of the rack 11 from the enclosure 100. Note that the locking position is generally known as the initial position, since the racks 11 holding a server thereon are not pulled outward from the enclosure 100.

The quick release rack structure 1 of the present invention further includes a biasing member 14 disposed between and biasing the rack 11 and the rotary rod 12 to facilitate rotation of the rotary rod 12 about the pivot pin 13 during movement between the locking and unlocked positions. Preferably, the biasing member 14 is a spring or a torsion spring having a circular portion sleeved around the pivot pin 13 and two opposite ends fixed respectively to the rack 11 and the rotary arm 12.

Figure 5:
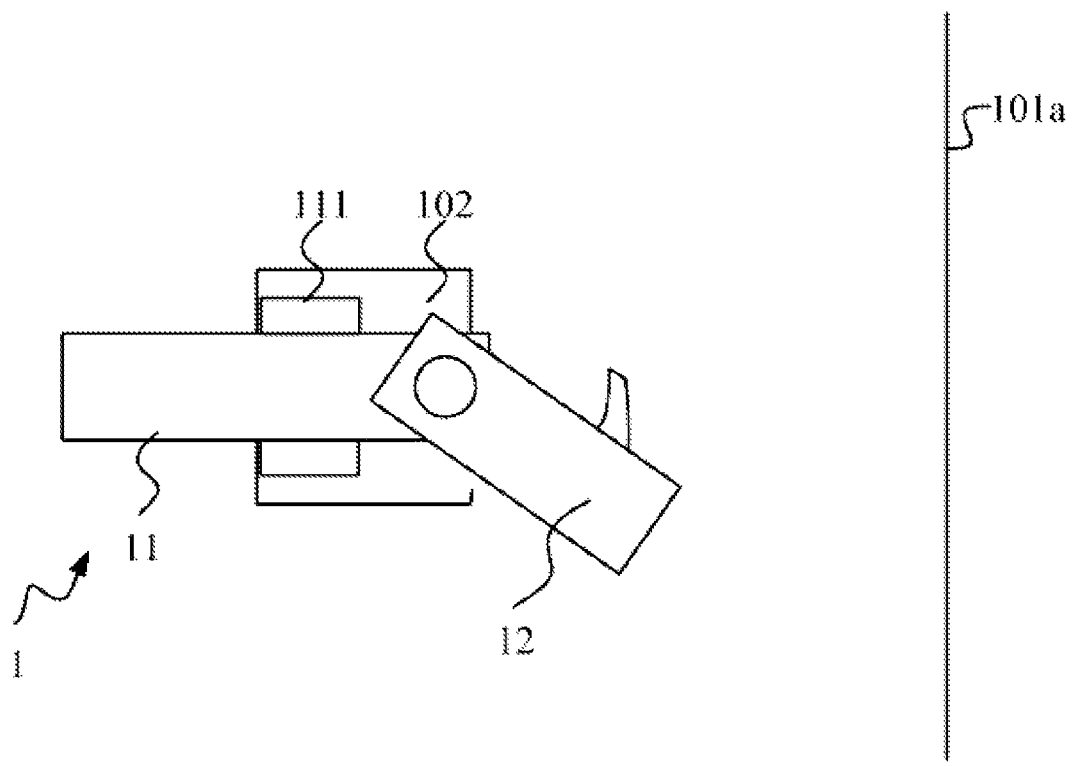
FIG. 5 is a lateral side view of the quick release rack structure of the present invention, wherein the rotary rod of the rack structure is shown in the unlocked position relative to the rack.

FIG. 5 is a lateral side view of the quick release rack structure 1 of the present invention, wherein the rotary rod 12 of the rack structure is shown in the unlocked position relative to the rack 11. As illustrated, when it is desired to replace a server with a new ones, the rotary rod 12 can be rotated about the pivot pin 13 relative to the rack 11 so as to move the slide stick 121 within the retention groove 103 from its initial position such that the slide stick 121 engages the second end of the retention groove 103, thus maintaining the rotary rod 12 at the unlocked position. At this time, the racks 11 can be pulled outward from the slide channels 102 so as to permit removal of the rack 11 from the enclosure 100 or replacement of a server or repairing on a specific server can be conducted. Note that in this embodiment, the slide stick 121 is a cylindrical rod that projects outwardly from a side surface of the rotary rod 12 into the retention groove 103. Alternately, the slide stick 121 projects outwardly from a side surface of the rotary rod 12 and has polygonal side surfaces.

Figure 6:
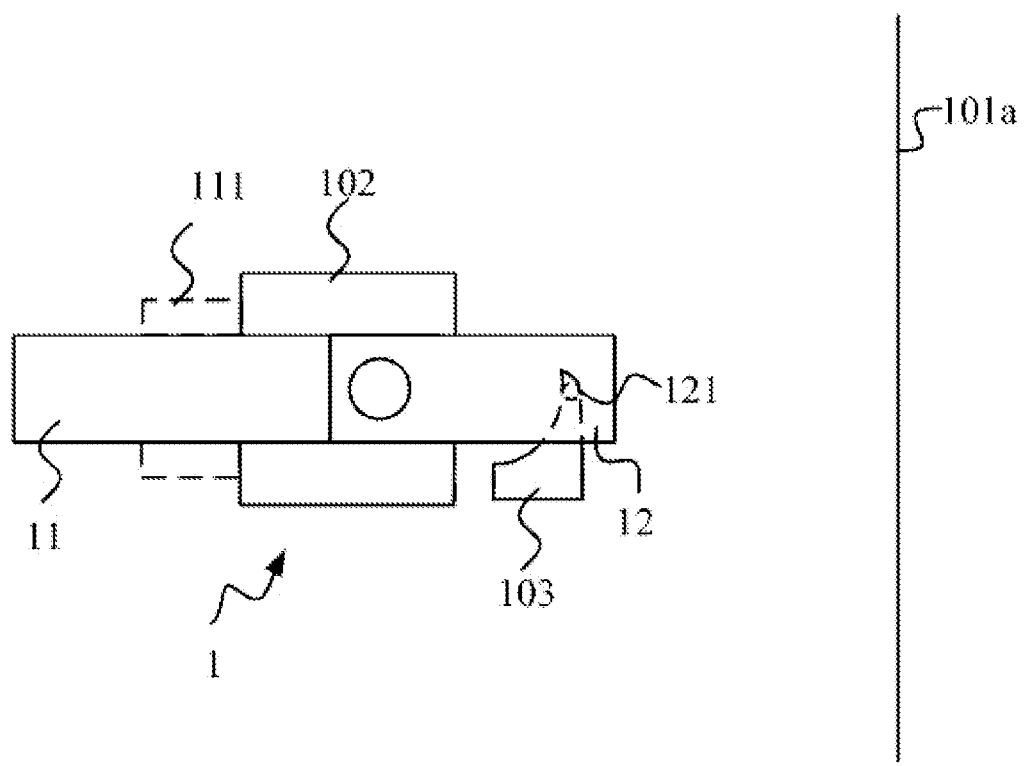
FIG. 6 is a lateral side view of the quick release rack structure of the present invention, wherein the rotary rod of the rack structure is shown in a locking position relative to the rack.

FIG. 6 is a lateral side view of the quick release rack structure 1 of the present invention, wherein the rotary rod 12 of the rack structure 1 is shown in the locking position relative to the rack 11. At this time, the rotary rod 12 is generally aligned with the rack 11 while the slide stick 121 engages a first end of the retention groove 103 so as to retain the rack 11 non-movably in the slide channel 102 and thus preventing the rack 11 from being pulled outward from the slide channel 102. In other words, the blade server held by the pair of racks 11 is maintained stably within the enclosure 100. However, in case of replacing a new blade server for old ones, the rack structure 1 of the present invention can be easily and quickly detached from the partitions 101 of the enclosure 100.

In one aspect of the present invention, the rack 11 can be mounted directly within a slide channel 102 defined by a single channel forming element or elements.

An important to note is that the retention groove 103 can be directly formed in the partition 101 of the enclosure 100 rather the presently disclosed embodiment. In the present embodiment, the retention groove 103 itself is generally curved to facilitate rotation of the rotary rod 12 and the first end of the retention groove 103 generally aligned with the rack 11 while the second end thereof is located a lower elevation relative to the first end. However, if desired, the position of the second end of the retention groove 103 can be reversed, that is formed at a higher elevation relative to the first end. Under this condition, for disposing the rotary rod 12 at the unlocked position, the rotary rod 12 should be turned upward about the pivot pin 13 relative to the rack 11. This action also provides the same effect.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A server casing with a quick release rack structure for a server, comprising:
    a slide channel and a retention groove formed in a server system;
    a rack formed with at least one engagement element that is adapted to be slidable and selectively secured within the slide channel; and
    a rotary rod having a first end connected pivotally to said rack via a pivot pin and a second end provided with a slide stick extending slidably into the retention groove.

2. The server casing with the quick release rack structure according to claim 1, wherein the slide channel is T-shaped generally and extends in a horizontal direction such that one portion thereof has a greater width when compared to a narrower width of the other portion thereof.

3. The server casing with the quick release rack structure according to claim 2, wherein said engagement element is disposed at one side surface of said rack and extends perpendicularly and upwardly with respect to a longitudinal length of said rack.

4. The server casing with the quick release rack structure according to claim 2, wherein said rotary rod is rotatable about said pivot pin relative to said rack between a locking position, where said rotary rod is generally aligned with said rack with said engagement element being located within the narrower width portion of the slide channel while said slide stick engages a first end of said retention groove so as to retain said rack non-movably in the slide channel, and an unlocked position, said rotary rod extends generally transverse to said rack with said engagement element being located within the greater width portion of the slide channel while said slide stick engages a second end of said retention groove opposite to said first end.

5. The server casing with the quick release rack structure according to claim 4, wherein when said rotary rod is disposed at said unlocked position, said engagement element of said rack is slidable within the slide channel so as to permit sliding action of said rack within the slide channel.

6. The server casing with the quick release rack structure according to claim 4, wherein when said rotary rod is disposed at said locked position, said engagement element of said rack is retained non-movably within the slide channel.

7. The server casing with the quick release rack structure according to claim 4, wherein said slide stick is a cylindrical rod that projects outwardly from a side surface of said rotary rod.

8. The server casing with the quick release rack structure according to claim 4, wherein said slide stick projects outwardly from a side surface of said rotary rod, and has polygonal side surfaces.

9. The server casing with the quick release rack structure according to claim 4, wherein in said locking position, said rotary rod is located at a higher elevation relative to said unlocked position and vice versa.

10. The server casing with the quick release rack structure according to claim 1, wherein said engagement element of said rack is inserted selectively secured and slidably into the slide channel formed in the server system.

11. The server casing with the quick release rack structure according to claim 1, further comprising a biasing member disposed between and biasing said rack and said rotary rod to facilitating rotation of said rotary rod about said pivot pin during movement between said locking and unlocked positions.

12. The server casing with the quick release rack structure according to claim 11, wherein said biasing member is a spring having a circular portion sleeved around said pivot pin and two opposite ends fixed respectively to said rack and said rotary rod.

13. The server casing with the quick release rack structure according to claim 11, wherein said biasing member is a torsion spring.

14. The server casing with the quick release rack structure according to claim 1, wherein said rotary rod is connected pivotally to said rack via said pivot pin.

15. The server casing with the quick release rack structure according to claim 1, wherein said rotary rod is fabricated from plastic materials.

16. The server casing with the quick release rack structure according to claim 1, wherein said rack is fabricated from metal.

17. A server casing with quick release rack structure for a server, comprising:
    two partitions having opposite side surfaces, each of which is formed with a slide channel and a retention groove;
    a pair of racks, each of which is formed with at least one engagement element that is adapted to be slidable and selectively secured within said slide channel of a respective one of said partitions; and
    a pair of rotary rods, each having a first end connected pivotally to a respective one of said racks via a pivot pin and a second end provided with a slide stick extending slidably into said retention groove of said respective one of said partitions.

18. The server casing according to claim 17, wherein the server is adapted to be mounted on the server casing via said pair of racks.

19. The server casing according to claim 17, wherein the slide channel is T-shaped generally and extends in a horizontal direction such that one portion thereof has a greater width when compared to a narrower width of the other portion thereof.

20. The server casing according to claim 19, wherein said engagement element is disposed at one side surface of said rack and extends perpendicularly and upwardly with respect to a longitudinal length of said rack.

* * * * *